(12) United States Patent
Nuebling et al.

(10) Patent No.: US 8,816,653 B2
(45) Date of Patent: Aug. 26, 2014

(54) CIRCUIT INCLUDING A TRANSFORMER FOR DRIVING A SEMICONDUCTOR SWITCHING ELEMENT

(75) Inventors: Marcus Nuebling, Esting (DE); Jens Barrenscheen, Munich (DE); Bernard Strzalkowski, Munich (DE)

(73) Assignee: Infineon Technologies Austria AG, Villach (AT)

( * ) Notice: Subject to any disclaimer, the term of this patent is extended or adjusted under 35 U.S.C. 154(b) by 1613 days.

(21) Appl. No.: 12/237,851

(22) Filed: Sep. 25, 2008

(65) Prior Publication Data

US 2010/0072971 A1     Mar. 25, 2010

(51) Int. Cl.
*G05F 1/00*     (2006.01)

(52) U.S. Cl.
USPC .............................. 323/222; 323/351; 363/60

(58) Field of Classification Search
USPC .......... 323/222, 351, 355; 327/108, 109, 110, 327/111, 112; 363/59, 60
See application file for complete search history.

(56) References Cited

U.S. PATENT DOCUMENTS

| | | | | |
|---|---|---|---|---|
| 4,551,635 A * | 11/1985 | Kuroki | ............................ | 327/482 |
| 4,554,512 A * | 11/1985 | Aiello | .............................. | 330/10 |
| 4,771,357 A * | 9/1988 | Lorincz et al. | ................... | 361/87 |
| 5,517,402 A | 5/1996 | Ikeda et al. | | |
| 5,530,385 A * | 6/1996 | Miettinen | ....................... | 327/108 |
| 5,686,854 A * | 11/1997 | Smith | ............................. | 327/374 |
| 7,619,447 B2 * | 11/2009 | Sutardja | ......................... | 327/108 |
| 7,936,152 B2 * | 5/2011 | Shimizu | ......................... | 323/222 |
| 8,004,344 B2 * | 8/2011 | Morong et al. | ................ | 327/427 |
| 8,063,670 B2 * | 11/2011 | Sutardja | ......................... | 327/108 |
| 8,084,894 B2 * | 12/2011 | Chen | .............................. | 307/140 |
| 2004/0232971 A1 | 11/2004 | Kawasaki et al. | | |

FOREIGN PATENT DOCUMENTS

| | | |
|---|---|---|
| DE | 3212320 | 10/1983 |
| DE | 3230080 A1 | 2/1984 |
| DE | 4441492 | 5/1996 |
| DE | 9316157 | 8/2003 |
| DE | 10354067 A1 | 11/2003 |
| JP | 2003244935 A | 8/2003 |

\* cited by examiner

*Primary Examiner* — Jue Zhang
*Assistant Examiner* — Lakaisha Jackson
(74) *Attorney, Agent, or Firm* — Dicke, Billig & Czaja, PLLC

(57) ABSTRACT

A circuit for a semiconductor switching element including a transformer. One embodiment provides a first voltage supply circuit having a first oscillator. A first transformer is connected downstream of the first oscillator. A first accumulation circuit for providing a first supply voltage is connected downstream of the first transformer. A driver circuit having input terminals for feeding in the first supply voltage and having output terminals for providing a drive voltage for the semiconductor switching element, designed to generate the drive voltage for the semiconductor switching element at least from the first supply voltage.

16 Claims, 10 Drawing Sheets

CIRCUIT INCLUDING A TRANSFORMER FOR DRIVING A SEMICONDUCTOR SWITCHING ELEMENT

BACKGROUND

Semiconductor components, such as power MOSFETs or power IGBTs, for example, are increasingly being used as switching elements for switching electrical loads. Power MOSFETs or power IGBTs are voltage-controlled components which are turned on or turned off depending on a drive voltage present at a drive connection (gate connection). The drive voltage can be generated by a drive circuit depending on a switching signal, which is e.g., a logic signal.

There are circuit applications in which the switching signal and the drive voltage are signals and voltages, respectively, which relate to different electrical reference potentials. This is the case, for example, when the semiconductor switching element is used as a high-side switch. In such an application, the reference potential for the drive voltage, which potential corresponds to the electrical potential at one of the load path connections of the semiconductor switching element, can change depending on the switching state of the semiconductor switching element. A drive voltage with such a changing reference potential can be generated using bootstrap circuits, level shifters or else electrical decoupling elements such as optocouplers or transformers, for example.

In addition to information about the switching signal, generation the drive voltage additionally requires a supply voltage from which the drive voltage is generated depending on the switching signal.

SUMMARY

One embodiment provides a drive circuit for a semiconductor switching element, including at least a first voltage supply circuit having a first oscillator, a first transformer, which is connected downstream of the first oscillator, and a first accumulation circuit for providing a first supply voltage, which is connected downstream of the first transformer; a driver circuit having input terminals for feeding in the first supply voltage and having output terminals for providing a drive voltage for the semiconductor switching element, which is designed to generate the drive voltage for the semiconductor switching element at least from the first supply voltage.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
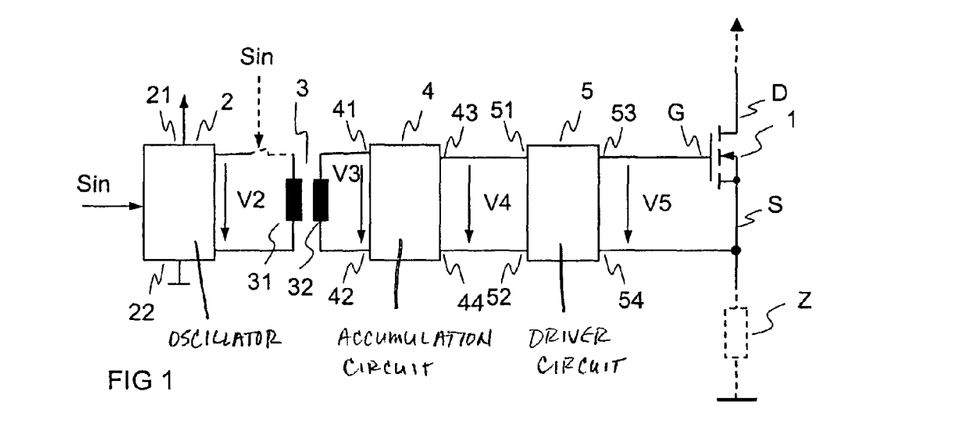
FIG. 1 illustrates one embodiment of a drive circuit including a first voltage supply circuit having an oscillator, a transformer and an accumulation circuit and a driver circuit connected to the first voltage supply circuit.

FIG. 1 illustrates one embodiment of a drive circuit for generating a drive voltage of a semiconductor switching element. For explanation purposes, such a semiconductor switching element 1 is likewise illustrated in FIG. 1. The semiconductor switching element 1 has a drive connection and a load path and, in the example illustrated, is a normally off n-channel MOSFET having a gate connection G as drive connection and a drain-source path as load path. It should be pointed out that the use of an n-channel MOSFET as semiconductor switching element should be understood merely as an example and that, of course, any other semiconductor switching elements, that is to say e.g., p-conducting MOS- FETs, IGBTs or bipolar transistors can be used as semiconductor switching elements. During the operation of the drive circuit and the semiconductor switching element 1, the semiconductor switching element 1 is connected with its load path, for example, in series with an electrical load Z (illustrated by dashed lines) between supply voltage terminals. The load Z can be any desired electrical load and can in one embodiment also include a further semiconductor switching element with which the semiconductor switching element 1 illustrated in FIG. 1 jointly forms a half-bridge.

A drive voltage V5 generated by the drive circuit serves for driving the semiconductor switching element 1 in the on state or in the off state. The MOSFET illustrated in FIG. 1 is turned on depending on a voltage present between its gate connection G and its source connection S. In the embodiment illustrated, therefore, outputs 53, 54 of the drive circuit, at which outputs the drive voltage is available, are connected between the gate connection G and the source connection S of the MOSFET. It generally holds true that the output connections 53, 54 of the drive circuit are to be connected to the connections of the semiconductor switching element which serve for the application of a drive voltage for the semiconductor switching element. The drive circuit illustrated in FIG. 1 includes a first voltage supply circuit having a first oscillator 2, a first transformer 3, which is connected downstream of the first oscillator 2, and a first accumulation circuit 4, which is connected downstream of the first transformer 3 and which provides a first supply voltage V4. The drive circuit additionally includes a driver circuit 5, to which the first supply voltage 4 is fed at input terminals 51, 52 and which is configured to make available the drive voltage V5 at output terminals 53, 54 of the driver circuit 5, which simultaneously form output terminals of the drive circuit. The driver circuit 5 is designed to generate the drive voltage V5 at least from the first supply voltage V4. In a manner yet to be explained, there is also the possibility of also generating the drive voltage from a plurality of supply voltages.

The oscillator 2 is designed to generate an oscillating output signal V2 depending on a switching signal Sin. The switching signal Sin is a two-value signal, for example, which can assume a switch-on level and a switch-off level. In the drive circuit illustrated in the figure, in a manner yet to be explained, the drive voltage V5 is generated depending on the switching signal Sin in such a way that the drive voltage V5, when the switching signal Sin assumes a switch-on level, has a voltage level suitable for driving the semiconductor switching element 1 in the on state, and, when the switching signal Sin assumes a switch-off level, assumes a voltage level suitable for driving the semiconductor switching element 1 in the off state. It should be pointed out in this context that there may be a switching delay between a level change of the switching signal Sin and a corresponding level change of the drive voltage V5. Furthermore, the drive voltage V5, in contrast to the switching signal Sin, for example, is not necessarily a two-value signal.

In the embodiment illustrated, the oscillator 2 is driven by the switching signal Sin, and designed to generate an oscillating voltage V2 at its output in the case of a switch-on level of the switching signal Sin, and to generate a voltage of zero or a DC voltage at its output in the case of a switch-off level of the switching signal Sin. The oscillator 2 can be any desired free-running oscillator. A supply voltage for generating the oscillating output voltage V2 is fed to the oscillator 2 via voltage supply terminals 21, 22.

The oscillating voltage V2 available at the output of the oscillator 2 is fed to the transformer 3. The transformer 3 has a primary winding 31 and a secondary winding 32, which is inductively coupled to the primary winding 31. In this embodiment, the primary winding 31 is connected to an output of the oscillator 2, such that the output voltage V2 of the oscillator 2 is present across the primary winding V2 of the oscillator 2 across the primary winding 31. However, the primary winding 31 can also already be part of the oscillator. An output voltage V3 of the transformer 3 is present across the secondary winding 32 and is fed to the accumulation circuit 4 as input voltage at input terminals 41, 42. The transformer 3 serves to generate from the oscillating output voltage V3 of the oscillator 2 a second oscillating voltage V3, which is available at the output of the transformer 3. In this embodiment, the signal waveforms of the two oscillating voltages V2, V3 can differ depending on the properties of the transformer 3. It should also be pointed out in this context that the voltage V2 available at the output of the oscillator 2 can be, for example, a rectangular voltage, a triangular voltage or else a sinusoidal voltage.

The transformer 3 is, for example, a coreless transformer. Such a transformer can be realized in a space-saving manner in or on integrated circuits. Thus, there is the possibility, for example, of integrating some or all of the circuit components of the drive circuit explained in a semiconductor chip together with the transformer 3.

In the drive circuit illustrated, the transformer 3 has the task of transferring energy from its primary side to its secondary side. On the primary side, the energy is available in the form of the output voltage V2 of the oscillator 2, and, on the secondary side, the energy is available in the form of the output voltage V3 of the transformer 3. In this embodiment, an energy transfer takes place only when an oscillating voltage is present at the output of the oscillator, in other words not when the voltage is a DC voltage or zero. The switching signal Sin serves for controlling the energy transfer, in which case energy is transferred in the case of a switch-on level of the switching signal Sin and no energy is transferred in the case of a switch-off level of the switching signal. For this purpose-as illustrated-the oscillator 2 can be switched on and off in accordance with the switching signal Sin. As an alternative, there is the possibility of permanently operating the oscillator 2 and of opening and closing an electrically conductive connection between the oscillator 2 and the primary winding 31, 32 of the oscillator 2 in accordance with the switching signal Sin, as is illustrated by dashed lines in FIG. 1.

The accumulation circuit 4, to which the output voltage V3 of the transformer 3 is fed at input terminals 41, 42, serves to generate from the oscillating transformer output voltage V3 the first supply voltage V4, which is available at the output terminals 43, 44 of the accumulation circuit 4. This output voltage V4 is at least approximately a DC voltage during those time durations during which energy is transferred from the primary side to the secondary side of the transformer 3. When the oscillator 2 is activated, electrical charge is periodically fed to the accumulation circuit 4 by the transformer 3. The accumulation circuit 4 accumulates this electrical charge fed to it in order to provide the first supply voltage V4.

The accumulation circuit 4 can be a conventional circuit arrangement suitable for converting an AC voltage into a DC voltage, and in one embodiment for generating a DC voltage having a higher amplitude than the amplitude of the AC voltage fed to it. The accumulation circuit 4 is a charge pump circuit or a voltage multiplier, for example. Such circuit arrangements are known in principle, and so further explanation in respect thereof can be dispensed with in principle. To afford a better understanding, however, an example of such a voltage multiplier is illustrated in FIG. 2.

Figure 2:
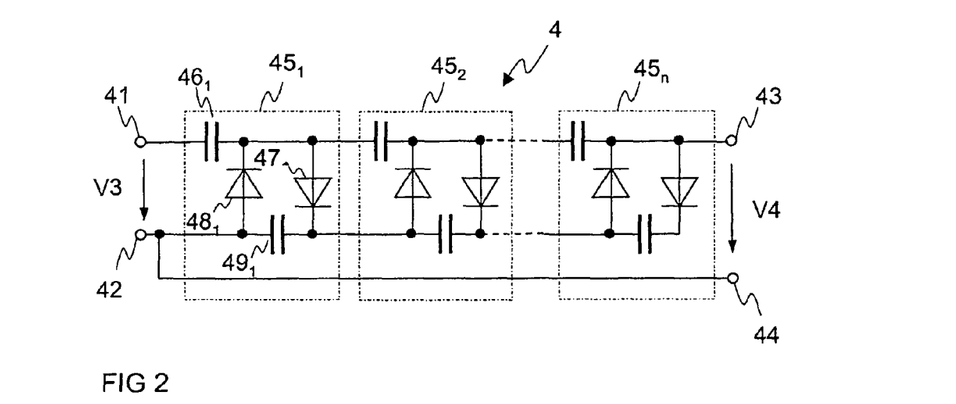
FIG. 2 illustrates one embodiment of an accumulation circuit.

The voltage multiplier illustrated in FIG. 2 includes a plurality of cascaded voltage doubling circuits $45_1$, $45_2$, $45_n$, which are each realized as Villard circuits in the example illustrated. Each of these voltage doubling circuits includes, referring to the first voltage doubling circuit $45_1$, two capacitive storage elements $46_1$, $49_1$ such as capacitors, for example, which are connected to one another by a first rectifier element $47_1$, such as a diode for example. A termination of the second capacitance $49_1$ that is remote from the first rectifier element $47_1$ is in this embodiment connected via a second rectifier element $48_1$ to the node common to the first capacitance $46_1$ and the first rectifier element $47_1$. In the cascade of the individual voltage doubling circuits, in each case the first capacitances ($46_1$ in the first voltage doubling circuit $45_1$) and the second capacitances ($49_1$ in the first voltage doubling circuit $45_1$) are in each case connected in series. In the case of this voltage multiplier 4, a voltage corresponding approximately to $2n$ times the amplitude of the input voltage V3 fed in, where n is the number of cascaded voltage doubling circuits, can be tapped off across the series connection of the second capacitances $49_1$. In the example illustrated, the output terminals 43, 44 are connected to the series connection of the second capacitances $49_1$. In a corresponding manner, the voltage across the series connection including the first capacitances $46_1$ could also be output as first supply voltage V4 at the output of the voltage multiplier circuit 4. This voltage corresponds to $(2n-1)$ times the amplitude of the input voltage V3. The voltage multiplier 4 includes at least one of these voltage doubling circuits connected between the input terminals 41, 42 and the output terminals 43, 44. In the case of the circuit arrangement illustrated in FIG. 1, energy is transferred from the primary side to the secondary side of the first voltage supply circuit in accordance with the switching signal Sin. This circuit transferred. This energy transfer from the primary side to the secondary side serves firstly for the voltage supply of the secondary-side components of the voltage supply circuit and the driver circuit 5 and serves secondly for information transfer, that is to say for transferring the information as to which switching state the semiconductor switching element 1 is intended to assume. The driver circuit 5 is designed to drive the semiconductor switching element 1 in the on state if energy is transferred, which is tantamount to the switching signal Sin assuming a switch-on level, and to drive the semiconductor switching element 1 in the off state if no energy is transferred, which is tantamount to the switching signal Sin assuming a switch-off level.

Figure 3:
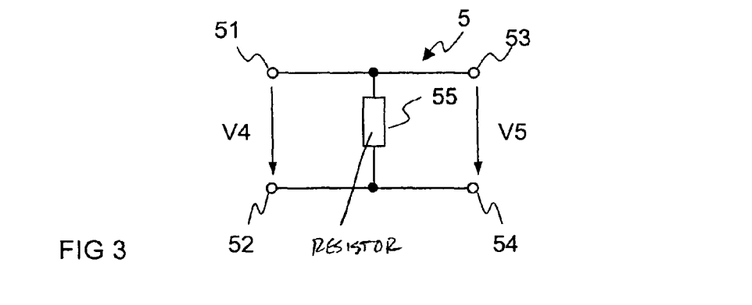
FIG. 3 illustrates one embodiment of a driver circuit.

FIG. 3 illustrates one embodiment of a driver circuit 5 that can be realized in a simple manner. This driver circuit includes an Ohmic resistor 55 connected between the input terminals 51, 52 and the output terminals 53, 54, wherein a first 51, of the input terminals and a first 53 of the output terminals are directly electrically conductively connected to one another and a second 52 of the input terminals and a second 54 of the output terminals are directly electrically conductively connected to one another. The first supply voltage V4 serves directly as drive voltage V5 in the case of this driver circuit 5. In this embodiment, the semiconductor switching element 1 is driven in the on state when this first supply voltage V4 lies above a threshold voltage of the semiconductor switching element 1. This makes use of the fact that the first supply voltage V4 is held at an upper voltage level as long as energy is transferred from the primary side to the secondary side. In the manner explained, this voltage level is dependent on the transformer output voltage V3 present at the output of the transformer 3 and on the accumulation circuit 4 used. As soon as energy is no longer transferred, that is to say if the switching signal Sin assumes a switch-off level, the first supply voltage V4 falls by virtue of the accumulation circuit 4 V4 falls by virtue of the accumulation circuit 4 being discharged via the resistor 55 of the driver circuit. In this embodiment, a delay duration between a level change of the switching signal Sin and a fall of the first supply voltage V4 is dependent on an RC element formed by capacitances of the accumulation circuit 4 and the resistor 55.

Figure 4:
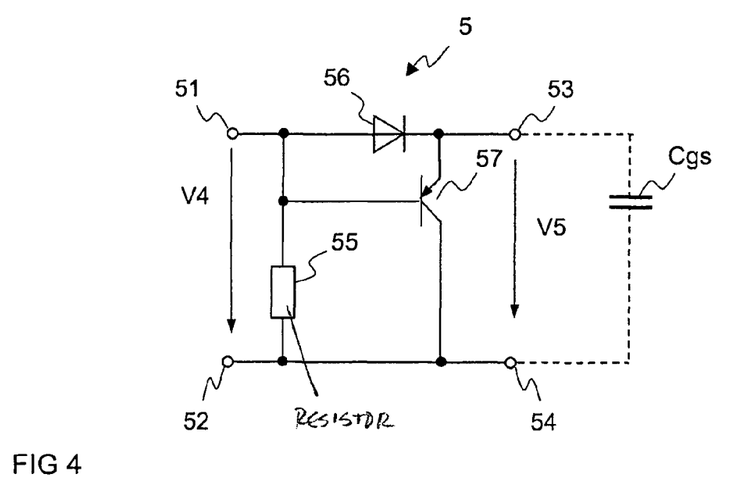
FIG. 4 illustrates one embodiment of a driver circuit.

FIG. 4 illustrates another embodiment of a driver circuit 5. In the case of this driver circuit 5, a load path of a transistor, of a p-transistor 57 in the example, is connected between the output terminals 53, 54 of the driver circuit 5. The driver circuit 5 additionally includes a rectifier element 56, such as a diode for example, which is connected in the forward direction between the first input terminal 51 and the first output terminal 53, and also the resistor 55 already explained above with reference to FIG. 3, which resistor is connected between the first and second input terminals 51 and 52 and serves to reduce the first supply voltage V4 if electrical energy is no longer transferred in the case of a switch-off level of the switching signal Sin. The transistor 57 is driven by the rectifier element 56 connected between its emitter and base connection. If, in the case of this circuit arrangement, the first supply voltage V4 falls relative to the output voltage V5 to an extent such that the voltage difference corresponds to the threshold voltage of the transistor 57, then the transistor 57 is driven in the on state in order also to decrease the output voltage V5 in a corresponding manner. It should be noted in this context that MOSFETs or IGBTs have a gate-source capacitance Cgs (illustrated by dashed lines in FIG. 4) that has to be discharged in order to drive the semiconductor switching element 1 in the off state. The gate-source capacitance, with the first supply voltage V4 falling, can be discharged more rapidly via the transistor 57 than in the case of the circuit arrangement in accordance with FIG. 3, in which this discharge has to be effected via the resistor 55.

Figure 5:
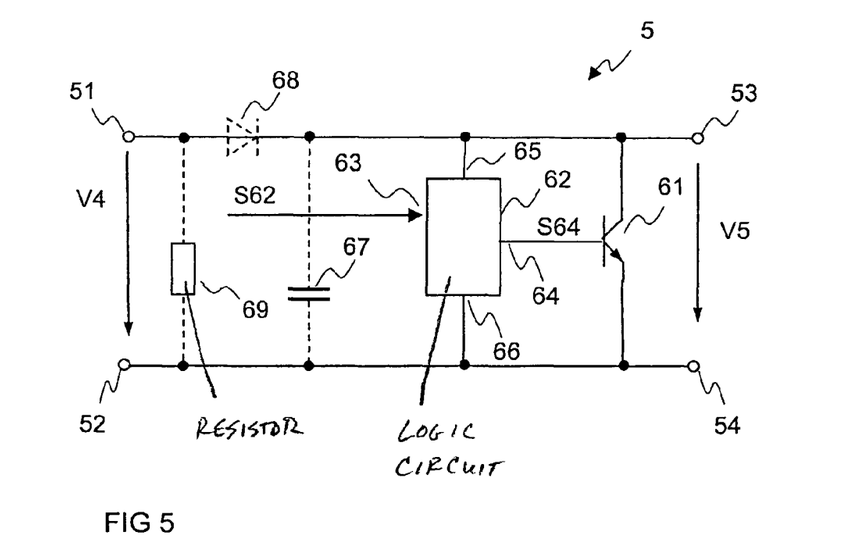
FIG. 5 illustrates one embodiment of a driver circuit having a semiconductor switching element connected between output terminals of the driver circuit and a drive circuit for the semiconductor switching element.

FIG. 5 illustrates another embodiment of a driver circuit 5 for providing the drive voltage V5 from the first supply voltage V4. This drive circuit 5 in accordance with FIG. 5 includes a first semiconductor switching element 61, the load path of which is connected between the output terminals 53, 54 of the driver circuit 5. In the example illustrated, the semiconductor switching element 61 is realized as an npn bipolar transistor, but can of course be any desired semiconductor switching element, in one embodiment also a MOS transistor. The first semiconductor switching element 61 is driven by a logic circuit 62. The logic circuit 62 has an input 63 for feeding in an input signal S62, an output 64 for providing a drive signal S64 for the first semiconductor switching element 61, and voltage supply inputs 65, 66 for feeding in a supply voltage.

The voltage supply of the logic circuit 62 can be effected directly by the first supply voltage V4, that is to say that the voltage supply connections 65, 66 can be connected directly between the input connections 51, 52 and the output connections 53, 54 of the driver circuit 5. There is optionally the possibility of providing a buffer capacitance or backup capacitance 67 (illustrated by dashed lines) connected in series with a rectifier element 68 (likewise illustrated by dashed lines) such as a diode for example, between the input terminals 51, 52. In this circuit, the rectifier element 68 and the buffer capacitance 67 function in the manner of a peak value rectifier, wherein the rectifier element 68 prevents a discharge of the buffer capacitance 67 via the input terminal 51, 52 if the first supply voltage V4 falls. In this embodiment, the voltage supply of the logic circuit 62 is effected via the buffer capacitance 67, that is to say that the voltage supply connections 65, 66 are connected to the buffer capacitance 67.

The first semiconductor switching element 61 is connected between the input terminals 51, 52 and in parallel with the buffer capacitance 67. The switching state of the first semiconductor switching element 1 directly determines the value of the drive voltage V5. If the first semiconductor switching element 61 is turned off, then the drive voltage V5 corresponds to the voltage across the buffer capacitance 67 or to the first supply voltage V4 (if no buffer capacitance 67 is present). If the first semiconductor switching element 61 is turned on, then the drive voltage V5 is approximately zero or less than a voltage required for driving the semiconductor switching element in the on state, and the semiconductor switching element (1 in FIG. 1) driven by the drive circuit is turned off. Both when the buffer capacitance is present and when it is absent, the drive voltage is generated from the first supply voltage. The input signal S62 fed to the logic circuit 62 contains information about whether energy is transferred from the primary side to the secondary side of the transformer, and thus contains information about the signal level of the switching signal Sin. The first supply voltage V4, for example, serves as input signal S62 of the logic circuit 62.

Figure 6:
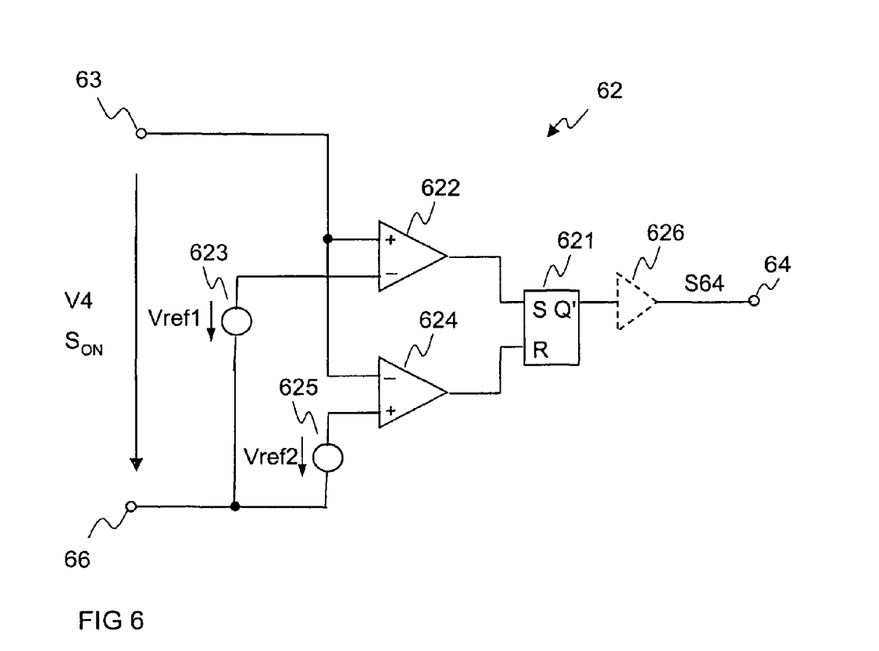
FIG. 6 illustrates one embodiment of the drive circuit for the semiconductor switching element.

FIG. 6 illustrates one embodiment of a logic circuit 62 that evaluates the first supply voltage V4 in order to generate the output signal S64. The output signal S64 can assume a switch-on level, at which the first semiconductor switching element 61 is turned on, and a switch-off level, at which the first semiconductor switching element 61 is turned off. The logic circuit 62 illustrated in FIG. 6 is designed to generate a switch-on level of the output signal S64 if the first supply voltage V4 exceeds a predetermined first reference value Vref1, and to generate a switch-off level of the output signal S64 if the first supply voltage V4 falls below a second voltage level Vref2. In this embodiment, the second voltage level Vref2 is, in one embodiment, less than the first voltage level Vref1. In order to generate the output signal S64, the output signal S64, the logic circuit 62 has a flip-flop 621, for example, which can be set by a first comparator 622 and reset by a second comparator 624. The first comparator 622 compares the first supply voltage V4 with the first voltage threshold Vref1, which is provided by a first reference voltage source 623, and sets the flip-flop if the first supply voltage V4 exceeds the first threshold value Vref1. The second comparator 624 compares the first supply voltage V4 with the second threshold value Vref2, which is provided by a second reference voltage source 625. The second comparator 624 resets the flip-flop 621 if the first supply voltage V4 falls below the second threshold value Vref2. In the case of the logic circuit 62 illustrated, a supply voltage V4 lying above the first threshold value Vref1 serves as an indication of an energy transfer currently taking place, that is to say of a switch-on level of the switching signal Sin. In this embodiment, the drive voltage V5 referring to FIG. 5, is intended to correspond to the first supply voltage V4 or to the voltage across the buffer capacitance 67. The first semiconductor switching element 61 is therefore intended to be turned off. In the case of the logic circuit 62 illustrated in FIG. 6, the output signal S64 is the signal at the inverting input Q' of the flip-flop 621, which, with the flip-flop set, assumes a low level or switch-off level and thereby turns off the first semiconductor switching element 61. The output signal of the flip-flop 621 can optionally be amplified by a driver circuit 626.

In the case of the logic circuit 62 illustrated in FIG. 6, a fall of the first supply voltage V4 below the second reference value Vref2 serves as an indication of the fact that no energy transfer is currently taking place, that is to say that the switching signal Sin assumes a low level. In this embodiment, the flip-flop 621 is reset, whereby the output signal S64 assumes a high level or a switch-on level a high level or a switch-on level and thereby drives the first semiconductor switching element 61 in the on state in order to set the drive voltage V5 to zero.

Figure 7:
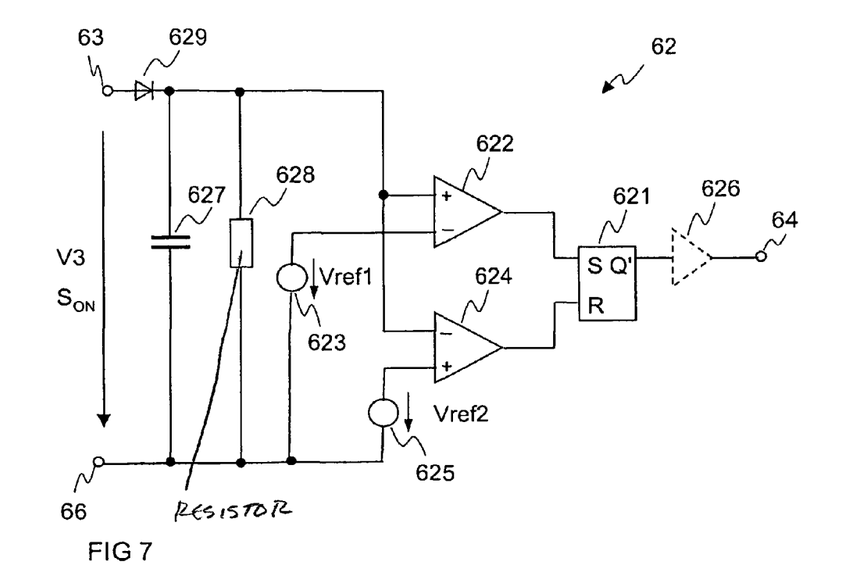
FIG. 7 illustrates one embodiment of the drive circuit for the semiconductor switching element.

The monitoring of the first supply voltage V4 for determining the signal state of the switching signal Sin can entail comparatively long delay times since a fall of the first supply voltage V4 requires a discharge of the capacitances present in the accumulation circuit 4. Referring to FIG. 7, in a further example, provision is made for deriving information about the signal state of the switching signal Sin from the output voltage V3 of the transformer. This transformer output voltage V3 is an oscillating voltage if the switching signal Sin assumes a switch-on level, and is otherwise zero.

The logic circuit 62 in accordance with FIG. 7 is designed to detect whether the transformer output voltage V3 is an oscillating voltage or a DC voltage or zero. If the transformer output voltage V3 is an oscillating voltage, then the output signal S64 assumes a switch-off level or low level in order to drive the first semiconductor switching element 61 in the off state. If the transformer output voltage is zero, then the output signal S64 assumes a switch-on level or high level in order to drive the first semiconductor switching element 61 in the on state. In order to detect the signal profile of the transformer output voltage V3, the logic circuit 62 illustrated includes a series connection including a capacitance 627 and a rectifier element 629, across which the transformer output voltage V3 is present, and also a resistor 628 connected in parallel with the capacitance 627. As long as the transformer output voltage V3 is an oscillating voltage, the capacitance 627 is regularly charged to the peak value of the transformer output voltage V3 via the rectifier element and is partly discharged again through the resistor 628. The rectifier element 629 ensures that the capacitance 627 can only be discharged via the resistor 628. Falls can. If the transformer output voltage V3 falls to zero, then the capacitance 627 is also discharged to zero. It is noted in this context that the capacitance 627 of this logic circuit 62 can be chosen to be significantly smaller with regard to the capacitance value than the capacitances of the accumulation circuit 4, such that when the transformer output voltage V3 falls to zero, the capacitance 627 can be discharged significantly more rapidly. Furthermore, the resistor 628 can also be comparatively small. When dimensioning these two circuit components 627, 628 it must merely be ensured that the capacitance 627 is not discharged down to the threshold value Vref2, yet to be explained, as early as during a period of the oscillating transformer output voltage V3.

An evaluation circuit is connected to the capacitance 627, the evaluation circuit corresponding to the evaluation circuit for the evaluation of the first supply voltage V4 as explained with reference to FIG. 6. In the case of the logic circuit 62 in accordance with FIG. 7, this evaluation circuit serves to evaluate the voltage present across the capacitance 627 and to generate a switch-on signal of the output signal S64 if this voltage falls below the second reference value Vref2. A switch-off level of the output signal S64 is generated as soon as the voltage across capacitance 627 rises above the first reference value Vref1. In the case of this evaluation circuit, the first and the second reference value can be identical and can differ with regard to their value from the reference values Vref1, Vref2 of the circuit in accordance with FIG. 6. It should be mentioned in this context that the flip-flop 621 in the circuits in accordance with FIGS. 6 and 7 is, for example, a positive-edge-triggered flip-flop level-triggered flip-flop.

Figure 8:
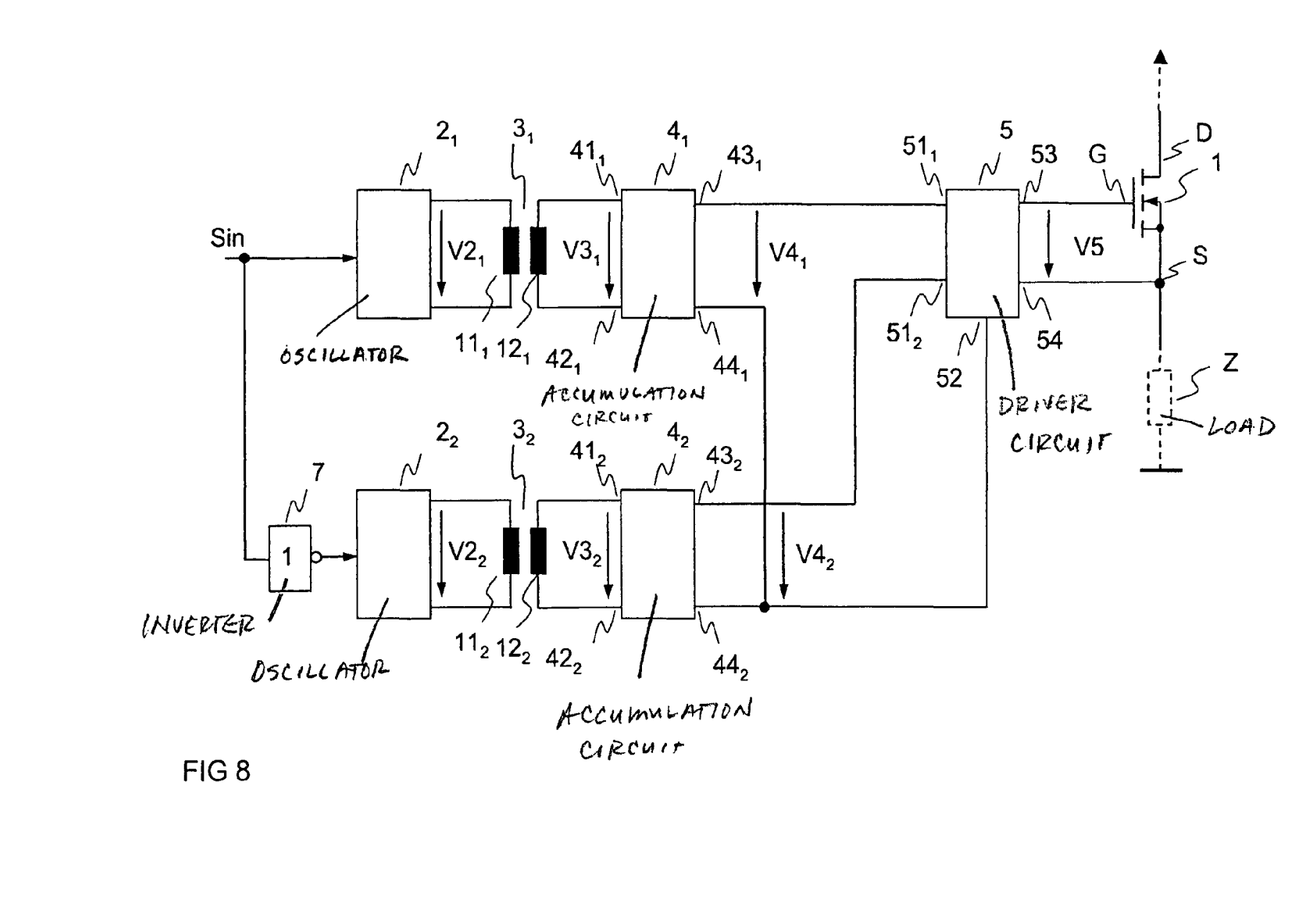
FIG. 8 illustrates one embodiment of a drive circuit including a first and a second voltage supply circuit for providing first and second supply voltages and a driver circuit, to which the two supply voltages are fed.

FIG. 8 illustrates one embodiment of a drive circuit for generating the drive voltage V5 for the semiconductor switching element 1. This drive circuit includes a first voltage supply circuit for providing a first supply voltage $V4_1$ and a second supply voltage $V4_1$ and a second voltage supply circuit for providing a second supply voltage $V4_2$. The two voltage supply circuits are realized in accordance with the voltage supply circuit explained above with reference to FIG. 1 and each include an oscillator, a transformer connected downstream of the oscillator, and also an accumulation circuit connected downstream of the transformer. In FIG. 8, the individual components of the voltage supply circuits are designated by the same reference symbols as in FIG. 1, where the subscripted index "1" designates the components of the first voltage supply circuit and the subscripted index "2" designates the components of the second voltage supply circuit. With regard to the properties and the realization of the individual components of these voltage supply circuits, the explanations already given above in connection with FIG. 1 are applicable.

The first oscillator $2_1$ of the first voltage supply circuit and the second oscillator $2_2$ of the second voltage supply circuit are in each case driven by the switching signal Sin, but complementarily with respect to one another. At any point in time, therefore, only in each case one of the oscillators $2_1$, $2_2$ supplies an oscillating output signal, that is say that during any point in time energy is transferred only in one of the two voltage supply circuits from the primary side to the secondary side of the respective transformer $3_1$, $3_2$. For this purpose, the switching signal Sin is fed directly to one of the two voltage supply circuits-the first voltage supply circuit in the example-and is fed in a manner inverted via an inverter 7 to the other of the two voltage supply circuits-the second voltage supply circuit in the example.

The first and second supply voltages $V4_1$, $V4_2$ are fed to the driver circuit 5, which generates the drive voltage V5 for the semiconductor switching element 1 depending on the supply voltages $V4_1$, $V4_2$. These conductor switching element 1 generates. In the example illustrated, these supply voltages $V4_1$, $V4_2$ relate to a common reference potential, i.e. in the illustrated example to the electrical potential of the second input terminal 52 of the driver circuit 5, to which the second output terminals $44_1$ and $44_2$ of the accumulation circuits $4_1$ and $4_2$ are jointly connected. The first output terminals $43_1$, $43_2$ of the accumulation circuits $4_1$ and $4_2$ are connected to two separate inputs of the driver circuit 5, which are designated by $51_1$, $51_2$ in FIG. 8 and which are referred to hereinafter as first and second supply voltage inputs $51_1$, $51_2$.

Figure 9:
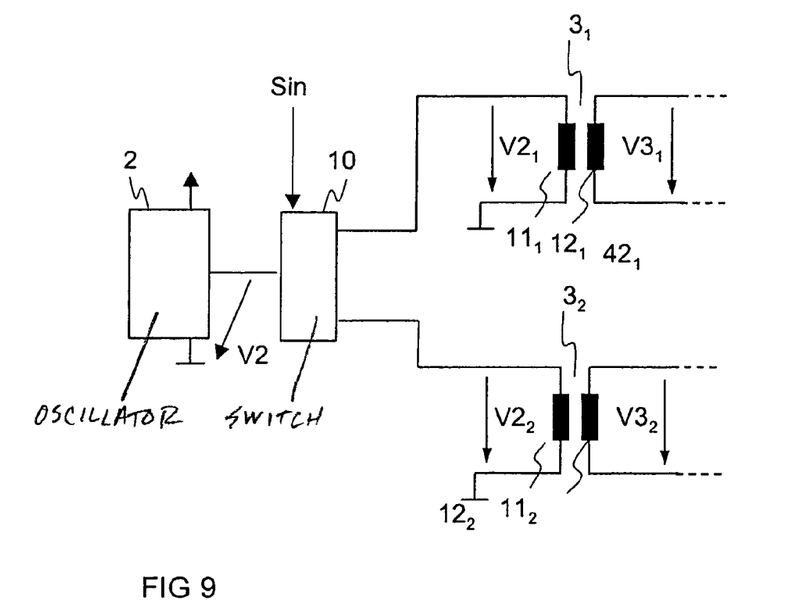
FIG. 9 illustrates part of a drive circuit that is modified in comparison with the drive circuit in accordance with FIG. 8.

In the case of the drive circuit illustrated in FIG. 8, an oscillating voltage is present only at one of the two transformers $3_1$, $3_2$ at any point in time in a manner controlled by the switching signal Sin. For this purpose, a respective one of the two oscillators $2_1$, $2_2$ is switched off in the case of the drive circuit illustrated. FIG. 9 illustrates an excerpt from a circuit arrangement that is modified by comparison with the drive circuit in accordance with FIG. 8 and has the same functionality. The circuit arrangement illustrated in FIG. 9 differs from that illustrated in FIG. 8 in that only one oscillator 2 is present which is driven permanently, and that the oscillator output voltage V2 is fed in accordance with the switching signal Sin via a changeover switch 10, such as a multiplexer for example, to the first transformer $2_1$ of the first voltage supply circuit or to the second transformer $3_2$ of the second voltage supply circuit. In accordance with the drive circuit illustrated in FIG. 8, an oscillating voltage is present at the first transformer $3_1$ in the case of a switch-on level of the switching signal Sin and at the second transformer $3_2$ in the case of a switch-off level of the switching signal Sin.

Figure 10:
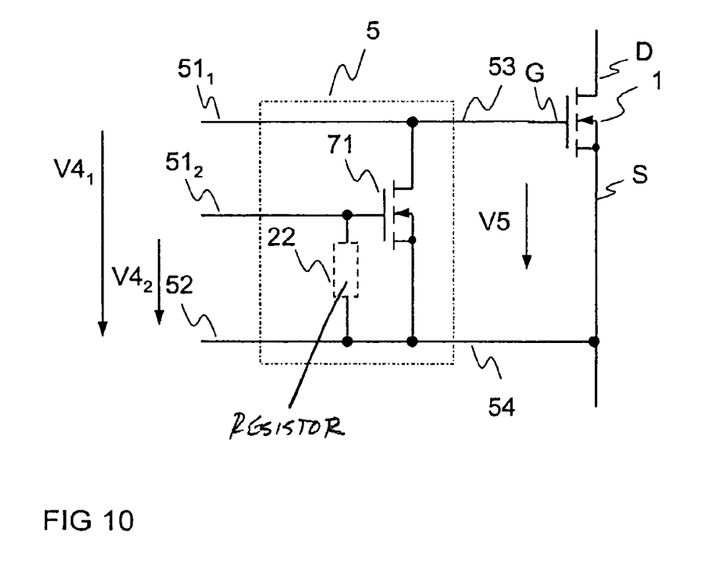
FIG. 10 illustrates one embodiment of a driver circuit to which two supply voltages are fed.

FIG. 10 illustrates one embodiment of a driver circuit 5 of the drive circuit in accordance with FIG. 8. This driver circuit 5 includes a semiconductor switching element 71 having a load path connected between the output terminals 53, 54 or the first supply voltage input $51_1$ and the second input terminal 52 of the driver circuit 5. This semiconductor switching element 71 is, for example, a MOS transistor (as illustrated) but can also be any other transistor, such as e.g., a bipolar transistor. This first semiconductor switching element 71 is driven by the second supply voltage $V4_2$. For this purpose, a drive connection, a gate connection in the example illustrated, of the first semiconductor switching element 71 is connected to the second supply voltage input $51_2$ of the driver circuit 5. A resistor 22 is optionally connected between the second supply voltage input $51_2$ and the second input terminal 52.

The second supply voltage $V4_2$ fulfills the function of a switch-off signal in the driver circuit 5 illustrated in FIG. 10. If the second supply voltage $V4_2$ exceeds the value of a threshold voltage of the first semiconductor switching element 71, then the first semiconductor switching element 71 is driven in the on state, whereby the drive voltage V5 falls to zero or at least to a value below the threshold voltage of the semiconductor switching element 1 that switches the load Z. In the case of the circuit arrangement illustrated, the semiconductor switching element 1 that switches the load is driven in the on state when the first drive voltage $V4_1$ is greater than the threshold voltage of the semiconductor switching element 1 and the second supply voltage $V4_2$ is less than the threshold voltage of the first semiconductor switching element 71.

Figure 11:
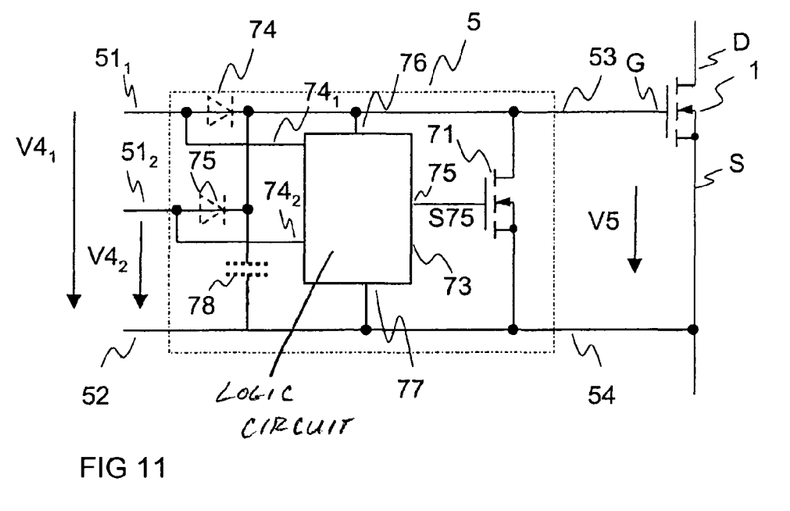
FIG. 11 illustrates one embodiment of a driver circuit to which two supply voltages are fed.

FIG. 11 illustrates one embodiment of a driver circuit for the drive circuit in accordance with FIG. 8. This driver circuit differs from that illustrated in FIG. 10 in that a logic circuit 73 is present for driving the first semiconductor switching element 71. In the example illustrated, the logic circuit 73 has two inputs $74_1$, $74_2$ for feeding in the first and inputs $74_1$, $74_2$ for feeding in the first and second supply voltages $V4_1$, $V4_2$, an output 75 for providing a drive signal for the first semiconductor switching element 71, and also voltage supply connections 76, 77. A voltage supply of this logic circuit 73 can be effected by any one of the two supply voltages $V4_1$, $V4_2$. A buffer capacitance 78 is optionally present, which is connected to the first supply voltage $V4_1$ via a first rectifier element $79_1$ and/or which is connected to the second supply voltage $V4_2$ by a second rectifier element $79_2$. In this embodiment, the voltage supply of the logic circuit 73 is effected via the buffer capacitance 78. When the semiconductor switching element 71 is in the off state, the drive voltage V5 corresponds to the voltage across the buffer capacitance 78. This voltage corresponds in each case to the peak value of one of the two supply voltages $V4_1$, $V4_2$.

The logic circuit 73 illustrated in FIG. 11 is designed to evaluate the first and second supply voltages $V4_1$, $V4_2$ and generates, for example, a switch-off signal for the first semiconductor switching element 71 if the first supply voltage $V4_1$ rises above a predetermined first reference value. In this embodiment, the drive voltage V5 corresponds to the first supply voltage $V4_1$ or to the voltage across the buffer capacitance 78. The logic circuit 73 is additionally designed to generate a switch-on level of the first semiconductor switching element 71 if the second supply voltage $V4_2$ rises above a second reference value, which, with regard to its magnitude, can correspond to the first reference value. The first semiconductor switching element 71 is driven in the on state in this embodiment, such that the drive voltage V5 is at least approximately zero. The evaluation of the supply voltages $V4_1$, $V4_2$ and the generation of the drive signal S75 can be effected analogously to the logic circuit 62 in accordance with FIG. 6 by using 62 in accordance with FIG. 6 by using reference voltage sources, comparators and a flip-flop.

The logic circuit 62 explained with reference to FIG. 7, the logic circuit 73 in accordance with FIG. 11 can also be designed to generate the drive signal S75 depending on the transformer output voltages ($V3_1$, $V3_2$ in FIG. 8). This logic circuit is then designed, for example, such that it generates a switch-off level of the output signal S75 if an oscillating voltage $V3_1$ is detected at the output of the first transformer $3_1$, and that it generates a switch-on level of the output signal S75 if an oscillating voltage $V3_2$ is detected at the output of the second transformer $3_2$. In accordance with the explanations concerning FIG. 7, an oscillating voltage can be detected by using a detection circuit including a capacitance, a resistor and a rectifier element (627, 628, 629 in FIG. 7).

In the case of the drive circuits explained above, the drive voltage V5 relative to the second output terminal 54 is either a positive voltage or zero. In order to ensure rapid switching of the semiconductor switching element 1, however, it may be desirable to make available either a positive voltage or a negative voltage as drive voltage V5 relative to the second output terminal 54.

Figure 12:
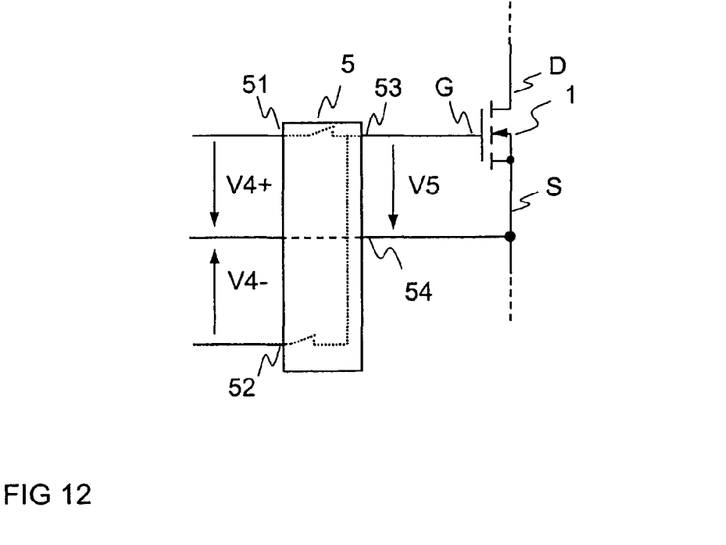
FIG. 12 schematically illustrates a driver circuit that generates a drive voltage optionally from a first or a second supply voltage.

FIG. 12 schematically illustrates the basic functioning of a driver circuit 5 to which are fed a positive first supply voltage V4+ relative to the potential of the second output terminal 54 and a negative supply voltage V4− relative to the potential of the second output terminal 54. The driver circuit 5 is designed optionally to apply one of the supply voltages V4+, V4− or a voltage dependent on the supply voltages V4+, V4− to the first output terminal 53 in order thereby optionally to generate a positive or a negative drive voltage V5.

Figure 13:
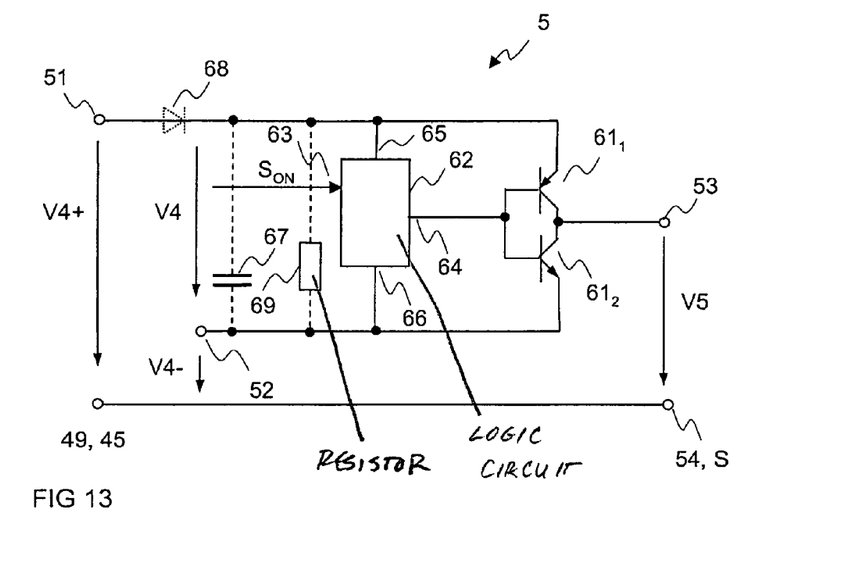
FIG. 13 illustrates an exemplary realization of the driver circuit in accordance with FIG. 12.

FIG. 13 illustrates a realization of a driver circuit 5 suitable for generating a positive or negative drive voltage V5. This driver circuit 5 corresponds to the driver circuit explained with reference to FIG. 5 with the difference that the second input terminal 52 is not connected to the second output terminal 54, and that a first semiconductor switching element $61_1$ is connected between the first input terminal 51 and the first output terminal 53 and a second semiconductor switching element $61_2$ is connected between the second input terminal 52 and the output terminal 53. These first and second semiconductor switching elements $61_1$, $61_2$ are driven complementarily with respect to one another. For this purpose, these two semiconductor switching elements $61_1$, $61_2$ are complementary transistors, in the illustrated example pnp and npn bipolar transistors, which are driven by a common drive signal. If, in the example illustrated, the first semiconductor switching element $61_1$ is turned on, then the positive supply voltage is present as drive voltage V5, and if the second semiconductor switching element $61_2$ is turned on, then the negative supply V4− is present as drive voltage V5. The generation of a drive signal S64 for the two semiconductor switching elements $61_1$, $61_2$ is effected by a logic circuit 62, which can correspond to the logic circuit 62 already explained with reference to FIGS. 6 and 7 and which generates the drive signal S64, for example, depending on the supply voltage V4 present between the input terminals 51, 52 or depending on the transformer output voltage V3.

Figure 14:
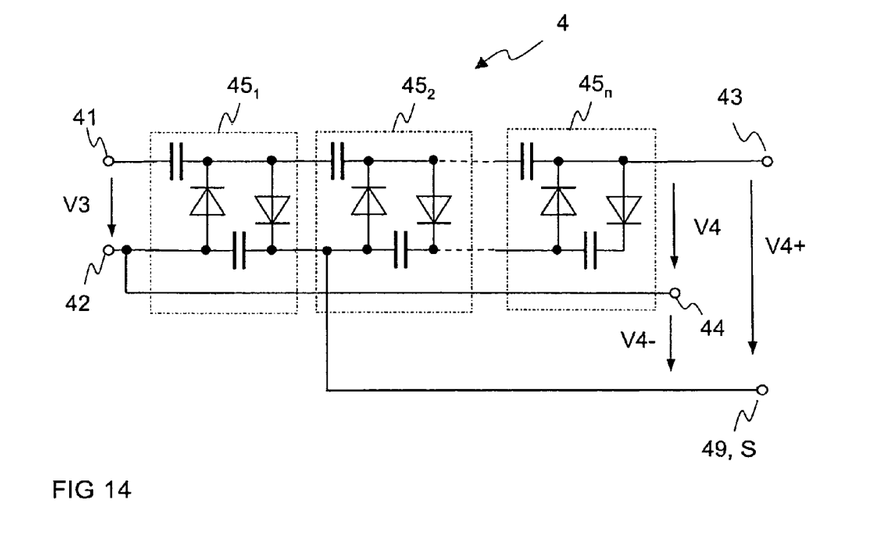
FIG. 14 illustrates one embodiment of an accumulation circuit that provides two supply voltages.

Referring to FIG. 14, a positive and a negative supply voltage V4+, V4− can be generated by a single accumulation circuit 4. This accumulation circuit 4 in accordance with FIG. 14 differs from the accumulation circuit 4 explained with reference to FIG. 2 in that it has a reference potential terminal 49 formed by a center tap of the series connection of the second capacitances. A positive supply voltage V4+ is in this embodiment present between the first output terminal 43 and the reference potential terminal 49 in this embodiment reference potential terminal 49 is present, and a negative supply voltage V4− is in this embodiment present between the second output terminal 44 and the reference potential terminal 49. The sum of these two voltage corresponds to the output voltage V4. The reference potential terminal 49 is connected to the second output connection 54 of the driver circuit 5 or the second load path connection or source connection of the semiconductor switching element 1. The reference potential terminal 49 is illustrated in FIG. 13. The ratio of the magnitudes between the positive supply voltage V4+ and the negative supply voltage V4− can be set by way of the position of the center tap in the series connection of the second capacitances. The closer the center tap is to the second output terminal 44, the smaller the magnitude of the negative voltage V4+ relative to the magnitude of the positive voltage V4+. Given three capacitances, the magnitude of the negative voltage V4−-as in the example illustrated-can be set such that it corresponds to 50% of the magnitude of the positive voltage V4+.

Figure 15:
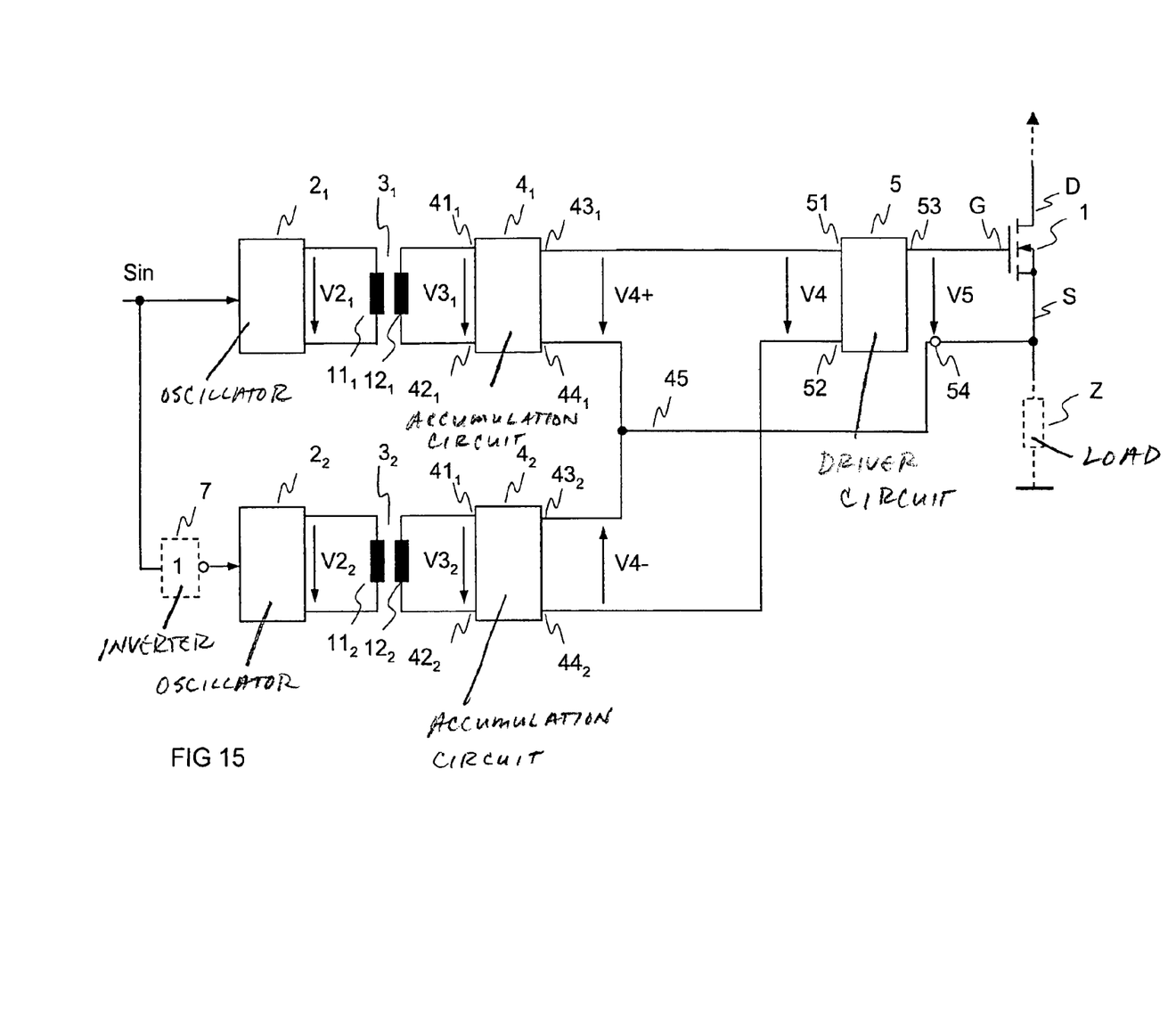
FIG. 15 illustrates one embodiment of a drive circuit including two voltage supply circuits.

FIG. 15 illustrates one embodiment of a drive circuit wherein a positive supply potential V4+ and a negative supply potential V4− are generated relative to the second output terminal 54 of the driver circuit 5. This drive circuit includes two voltage supply circuits which are in each case constructed in accordance with the voltage supply circuit explained with reference to FIG. 1, that is to say which each have an oscillator $2_1$, $2_2$, a transformer $3_1$, $3_2$ connected downstream of the oscillator, and an accumulation circuit $4_1$, $4_2$ connected downstream of the transformer. Identical components are designated in FIG. 15 by the same reference symbols as in FIG. 1, in which case, in order to distinguish the two voltage supply circuits, the components of the first voltage supply circuit are designated by the subscripted index "1" and the components of the second voltage supply circuit are designated by the subscripted index "2". The second output terminal $44_1$ of the first are. The second output terminal $44_1$ of the first accumulation circuit $4_1$ and the first output terminal $43_2$ of the second accumulation circuit $4_2$ are connected to a common circuit node 45, which forms a reference potential node to which the output voltages of the first and second voltage supply circuits relate. In this embodiment, the output voltage V4+ of the first voltage supply circuit is a positive voltage relative to the reference potential node 45, while the output voltage V4− of the second voltage supply circuit is a negative voltage relative to the reference potential node 45. The reference potential node 45 is connected to the second output terminal 54 of the driver circuit 5, or forms the second output terminal 54.

The driver circuit 5 of the drive circuit in accordance with FIG. 15 can be realized in a manner corresponding to the driver circuit 5 in accordance with FIG. 13. In this embodiment, the oscillators $2_1$, $2_2$ can be driven jointly by the switching signal Sin, wherein the logic circuit (62 in FIG. 13) evaluates, for example, the first output voltage V4+ or the first transformer output voltage $V3_1$ in order to determine the switching state of the switching signal Sin. As an alternative, the logic circuit 62 can of course also evaluate the second output voltage V4− or the second transformer output voltage $V3_2$. Given identical driving of the two oscillators $2_1$, $2_2$, both the output voltage V4+, V4− and the transformer output voltage $V3_1$, $V3_2$ behave in the same way depending on the switching signal Sin.

Figure 16:
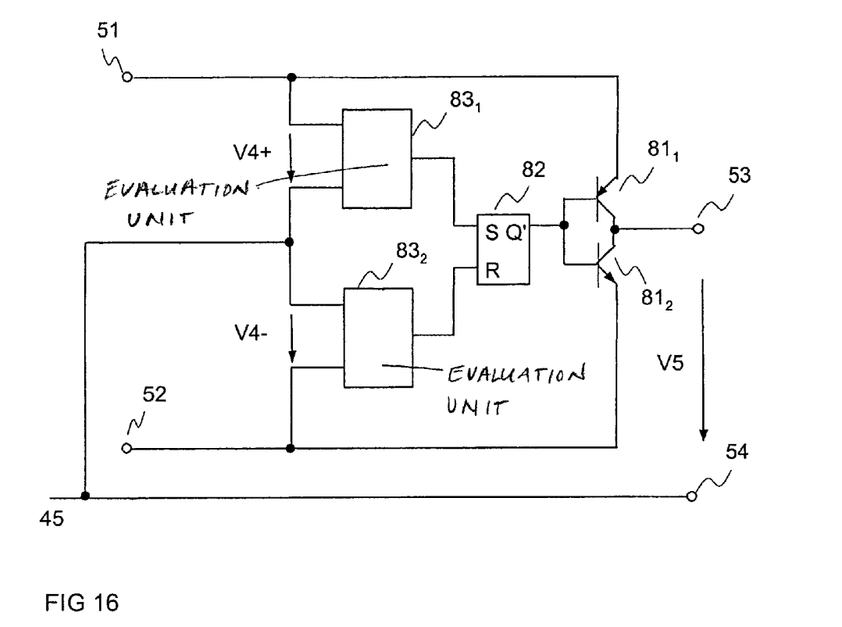
FIG. 16 illustrates one embodiment of a driver circuit for the drive circuit in accordance with FIG. 15.

There is the possibility of driving the two oscillators $2_1$, $2_2$ complementarily with respect to one another in the case of the drive circuit in accordance with FIG. 15. This can be done by feeding the switching signal Sin via an inverter 7 to one of the two oscillators $2_2$, as illustrated by dashed lines in FIG. 15. In accordance with the explanations concerning FIG. 9, there is also the possibility of providing only one oscillator explanations concerning FIG. 9 also the possibility of providing only one oscillator and of feeding the oscillator output signal to one of the two transformers $3_1$, $3_2$ in accordance with the switching signal Sin. In the case of such a realization of the two voltage supply circuits, the driver circuit 5 can be realized in such a way that it evaluates the first and the second output voltage V4+, V4− in order to generate the output voltage V5. An example of such a driver circuit 5 is illustrated in FIG. 16. This driver circuit, in a manner corresponding to the driver circuit illustrated in FIG. 13, has two mutually complementary semiconductor switching elements $81_1$, $81_2$, a first $81_1$ of which is connected between the first input terminal 51 and the first output terminal 53 and a second of which is connected between the second input terminal 52 and the first output terminal 53. These two semiconductor switching elements are driven by a common drive signal S82. The drive signal S82 is generated depending on the positive and negative supply voltages V4+, V4−. The driver circuit 5 has a first evaluation unit $83_1$ for evaluating the positive supply voltage V4+ and a second evaluation unit $83_2$ for evaluating the negative supply voltage V4−. In the example illustrated, the evaluation units $83_1$, $83_2$ drive a flip-flop 82, at the output of which the drive signal S82 is available.

The first evaluation unit $83_1$ is designed to set the flip-flop 82 if the positive supply voltage V4+ rises above the predetermined first reference value. In this embodiment, the first semiconductor switching element $81_1$ is turned on, whereby the positive supply potential V4+ is output as drive voltage V5. The second evaluation unit $83_2$ is designed to evaluate the negative supply voltage V4− and to reset the flip-flop 82 if the magnitude of the supply voltage V4− exceeds a second reference value, which can correspond in terms of magnitude to the first reference value. In this embodiment, the second is turned on exceeds. In this embodiment, the second semiconductor switching element $81_2$ is turned on, whereby the negative supply voltage is output as drive voltage V5. FIG. 16 does not illustrate a voltage supply circuit for the drive units $83_1$, $83_2$ and the flip-flop 82. Such a drive circuit can be present, of course, and can be realized in accordance with the explanations concerning FIG. 11, for example, by a buffer capacitance and two rectifier elements.

Instead of evaluating the positive and the negative supply voltage V4+, V4−, the drive units $83_1$, $83_2$ can also be realized in such a way that they evaluate the transformer output voltage $V3_1$, $V3_2$, wherein, for example, the positive supply voltage is output to the output if an oscillating voltage is detected as first transformer output voltage $V3_1$, and the negative supply voltage is output to the output if an oscillating voltage is output as second transformer output voltage $V3_2$.

Figure 17:
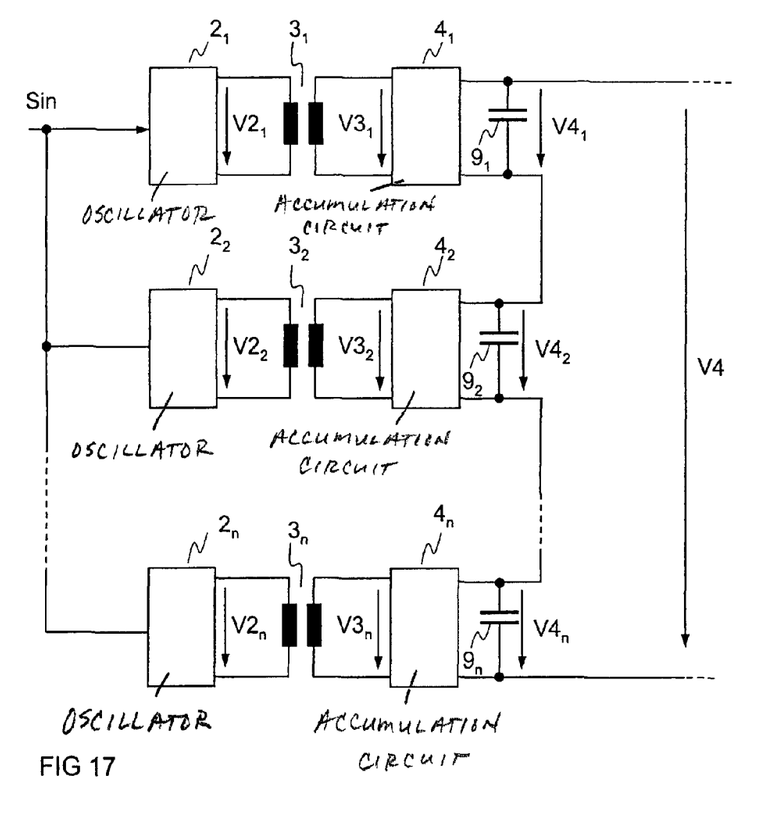
FIG. 17 illustrates a drive circuit including a plurality of cascaded voltage supply circuits each having an oscillator, a transformer and an accumulation circuit.

In the case of the drive circuits explained above, a supply voltage is generated only by one voltage supply circuit having an oscillator, a transformer and an accumulation circuit. Referring to FIG. 17, there is also the possibility of producing a voltage supply circuit 4 by cascading a plurality of voltage supply circuits. FIG. 17 illustrates by way of example three such voltage supply circuits, which are all realized according to the voltage supply circuit in accordance with FIG. 1 and which are cascaded in such a way that the second output connection of the accumulation circuit of one voltage supply circuit is respectively connected to the first input connection of the accumulation circuit of a next voltage supply circuit. In this embodiment, the supply voltage V4 can be tapped off between the first output connection of the accumulation circuit $4_1$ of the first accumulation circuit $4_1$ of the first voltage supply circuit of the cascade and the second output connection of the accumulation circuit $4_n$ of the last voltage supply circuit of the cascade. In such a circuit arrangement it is possible to generate in one embodiment a plurality of supply voltages having different amplitudes by tapping off voltages at intermediate taps of the cascade of voltage supply circuits.

Finally, it should be pointed out that features explained above in connection with only one example can be combined with features of other examples even if this was not explicitly mentioned. Thus, features of the claims specified below can be combined with one another as desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A circuit for driving a first semiconductor switching element, comprising:
    at least a first voltage supply circuit having a first oscillator;
    a first transformer, connected downstream of the first oscillator;
    a first accumulation circuit for providing a first supply voltage, connected downstream of the first transformer;
    a driver circuit having input terminals for receiving the first supply voltage and having output terminals for providing a drive voltage for the first semiconductor switching element, configured to generate the drive voltage for the first semiconductor switching element at least from the first supply voltage and depending on a level of the first supply voltage; and
    a second voltage supply circuit having a second transformer and a second accumulation circuit for providing a second supply voltage, connected downstream of the second transformer, wherein the second supply voltage is fed to the driver circuit; and
    wherein the driver circuit is configured to make available the first supply voltage or a voltage dependent on the first supply voltage as drive voltage if the second supply voltage is less than a predetermined threshold value.

2. The circuit of claim 1, wherein the driver circuit has a resistor connected between the input terminals and between the output terminals.

3. The circuit of claim 1, wherein the driver circuit has a transistor comprising a drive connection and a load path, the load path is connected between the output terminals and is driven depending on the first supply voltage.

4. The circuit of claim 3, wherein the transistor is driven in the on state if the first supply voltage falls below a predetermined first threshold value, and is driven in the off state if the first supply voltage rises above a predetermined second threshold value.

5. A circuit for a semiconductor switching element, comprising:
    at least a first voltage supply circuit having a first oscillator;
    a first transformer, connected downstream of the first oscillator;
    a first accumulation circuit for providing a first supply voltage, connected downstream of the first transformer;
    a driver circuit having input terminals for feeding in the first supply voltage and having output terminals for providing a drive voltage for the semiconductor switching element, configured to generate the drive voltage for the semiconductor switching element at least from the first supply voltage; and a second voltage supply circuit having a second transformer and a second accumulation circuit for providing a second supply voltage, connected downstream of the second transformer, wherein the second supply voltage is fed to the driver circuit, and wherein the driver circuit is configured to make available the first supply voltage or a voltage dependent on the first supply voltage as drive voltage if the second supply voltage is less than a predetermined threshold value.

6. The circuit of claim 5, the second voltage supply circuit comprising a second oscillator, connected upstream of the second transformer and activated depending on a drive signal complementarily with respect to the first oscillator.

7. The circuit of claim 5, wherein an output voltage of the first oscillator is fed to the first or the second transformer depending on a drive signal.

8. The circuit of claim 5, wherein the circuit is configured to generate the drive voltage from the first or the second supply voltage depending on a switching signal.

9. The circuit of claim 8, wherein the switching signal is dependent on the first supply voltage or is dependent on the second supply voltage.

10. A method for driving the semiconductor switching element of claim 5 comprising:
providing at least the first voltage supply circuit having the first oscillator;
providing the first transformer, connected downstream of the first oscillator;
providing the first supply voltage via the first accumulation circuit, connected downstream of the first transformer; and
receiving the first supply voltage via the driver circuit and having output terminals for providing the drive voltage for the semiconductor switching element, including generating the drive voltage for the semiconductor switching element at least from the first supply voltage and depending on the level of the first supply voltage.

11. An integrated circuit comprising:
at least a first voltage supply circuit having a first oscillator;
a first transformer, connected downstream of the first oscillator; and
a first accumulation circuit for providing a first supply voltage, connected downstream of the first transformer;
a driver circuit having input terminals for receiving the first supply voltage and having output terminals for providing a drive voltage for a first semiconductor switching element, configured to generate the drive voltage for the first semiconductor switching element at least from the first supply voltage and dependent on a voltage level of the first supply voltage,
a second voltage supply circuit having a second transformer and a second accumulation circuit for providing a second supply voltage, connected downstream of the second transformer,
wherein the second supply voltage is fed to the driver circuit, and
wherein the driver circuit is configured to make available the first supply voltage or a voltage dependent on the first supply voltage as drive voltage if the second supply voltage is less than a predetermined threshold value.

12. The circuit of claim 11 comprising a rectifier element and a resistor.

13. The circuit of claim 12, comprising a logic circuit configured to drive the first semiconductor switching element.

14. The circuit of claim 13, wherein the logic circuit includes a first comparator and a second comparator, coupled to a logic gate.

15. The circuit of claim 14, wherein the logic gate comprises a flip-flop.

16. The circuit of claim 11, comprising a logic circuit configured to drive the first semiconductor switching element.

* * * * *